United States Patent
Chin et al.

(10) Patent No.: US 12,045,482 B2
(45) Date of Patent: Jul. 23, 2024

(54) WORDLINE LEAKAGE TEST MANAGEMENT

(71) Applicant: MICRON TECHNOLOGY, INC., Boise, ID (US)

(72) Inventors: Wai Leong Chin, Singapore (SG); Francis Chee Khai Chew, Singapore (SG); Trismardawi Tanadi, Folsom, CA (US); Chun Sum Yeung, San Jose, CA (US); Lawrence Dumalag, Folsom, CA (US); Ekamdeep Singh, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/877,240

(22) Filed: Jul. 29, 2022

(65) Prior Publication Data

US 2024/0036753 A1    Feb. 1, 2024

(51) Int. Cl.
*G06F 3/06*     (2006.01)
*G06F 12/06*    (2006.01)

(52) U.S. Cl.
CPC ............ *G06F 3/064* (2013.01); *G06F 3/0604* (2013.01); *G06F 3/0653* (2013.01); *G06F 3/0679* (2013.01); *G06F 12/0646* (2013.01); *G06F 2212/7202* (2013.01); *G06F 2212/7204* (2013.01); *G06F 2212/7206* (2013.01)

(58) Field of Classification Search
CPC ...... G06F 3/0604; G06F 3/064; G06F 3/0653; G06F 3/0679; G06F 12/0646; G06F 2212/7202; G06F 2212/7204; G06F 2212/7205; G06F 2212/7206; G06F 2212/7211

USPC ......................................................... 711/200
See application file for complete search history.

(56) References Cited

U.S. PATENT DOCUMENTS

| | | | |
|---|---|---|---|
| 10,936,205 B2 * | 3/2021 | Papandreou | G06F 12/0246 |
| 2009/0125671 A1 * | 5/2009 | Flynn | G06F 11/1008 |
| | | | 711/170 |

(Continued)

OTHER PUBLICATIONS

Y. Luo, S. Ghose, Y. Cai, E. F. Haratsch and O. Mutlu, "HeatWatch: Improving 3D NAND Flash Memory Device Reliability by Exploiting Self-Recovery and Temperature Awareness," 2018 IEEE International Symposium on High Performance Computer Architecture (HPCA), Vienna, Austria, 2018, pp. 504-517 (Year: 2018).*

*Primary Examiner* — Reginald G Bragdon
*Assistant Examiner* — Aaron D Ho
(74) *Attorney, Agent, or Firm* — Lowenstein Sandler LLP (57) ABSTRACT

A processing device in a memory sub-system determines whether a media endurance metric associated with a memory block of a memory device satisfies one or more conditions. In response to the one or more conditions being satisfied, a temperature of the memory block is compared to a threshold temperature range. In response to determining the temperature of the memory block is within the threshold temperature range, the processing device causes execution of a wordline leakage test of a wordline group of a set of wordline groups of the memory block. A result of the wordline leakage test of the target wordline group is determined and an action is executed based on the result of the wordline leakage test.

14 Claims, 6 Drawing Sheets

(56) References Cited

U.S. PATENT DOCUMENTS

| | | | |
|---|---|---|---|
| 2012/0275228 A1* | 11/2012 | Lu | G11C 29/025 |
| | | | 365/185.18 |
| 2013/0170301 A1* | 7/2013 | Kochar | G11C 29/06 |
| | | | 365/185.18 |
| 2013/0229868 A1* | 9/2013 | Koh | G11C 16/10 |
| | | | 365/185.03 |
| 2014/0015138 A1* | 1/2014 | Davis | H10B 41/30 |
| | | | 438/657 |
| 2014/0084936 A1* | 3/2014 | Pan | G01R 19/0092 |
| | | | 324/509 |
| 2014/0085985 A1* | 3/2014 | Pan | G11C 16/06 |
| | | | 327/536 |
| 2014/0269090 A1* | 9/2014 | Flynn | G11C 16/14 |
| | | | 365/185.24 |
| 2017/0316834 A1* | 11/2017 | Huynh | G11C 16/3422 |
| 2019/0214067 A1* | 7/2019 | Nam | G11C 16/14 |
| 2019/0294368 A1* | 9/2019 | Hiraishi | G06F 3/064 |
| 2021/0240606 A1* | 8/2021 | Sarwar | G11C 29/52 |
| 2021/0349145 A1* | 11/2021 | Yang | G01R 31/2818 |
| 2022/0357874 A1* | 11/2022 | Pachamuthu | G06F 3/0679 |
| 2023/0021668 A1* | 1/2023 | Yeh | G06F 12/0246 |

\* cited by examiner

WORDLINE LEAKAGE TEST MANAGEMENT

TECHNICAL FIELD

Embodiments of the disclosure relate generally to memory sub-systems, and more specifically, relate to manage testing of a memory block to detect wordline leakage in a memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to testing to detect wordline leakage associated with a memory device in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. For example, an open block can refer to a block in which some of the wordlines have associated memory cells which have been programed, but other wordlines have associated memory cells which are not currently programmed (e.g., are in an erase state). A closed block can refer to a block in which all of the wordlines have associated memory cells which have been programmed. A block can also be characterized based on age, which can be defined in view of a media endurance metric associated with the memory block (e.g., a number of program/erase (P/E) cycles that have been performed with respect to the memory block). For example, a cycled block can refer to a block that has undergone a number of P/E cycles that exceeds a first threshold number of P/E cycles (e.g., an older block), and a fresh block can refer to a block that has undergone a number of P/E cycles less than a second threshold number of P/E cycles (e.g., a newer block).

As described above, a non-volatile memory device can include a number of individual blocks, each having a set of one or more wordlines that are used to access the memory cells of the block. Over time, as memory access operations, including program operations, read operations, and erase operations, are repeatedly performed on the blocks of the memory device, certain defects can develop. For example, an electrical short can develop between two adjacent wordlines. When a certain voltage, such as a program voltage, for example, is applied to one of those wordlines, a current is developed, at least a portion of which can flow through the electrical short and onto the adjacent wordline. This portion of the current can be referred to as a "leakage current" or "wordline leakage". Wordline leakage can impact the logical values programed to or read from the memory cells connected to the associated wordlines leading to errors on the memory device. The memory sub-system can employ an error detection/correction engine capable of detecting and correcting a certain number of errors. Such detection/correction engines may use an error correction code (ECC) to detect and/or correct the errors. An ECC failure results when the detection/correction engine is not capable of correcting the errors within the data being read. This can be referred to as an uncorrectable ECC error (a UECC error). Certain physical defects, including a wordline to wordline short, are considered UECC errors and, responsive to detecting such an error, the memory sub-system can retire the corresponding block such that it is not used to store data going forward.

Defects can occur in memory devices due to the manufacturing process and can occur during the operating life of the memory device. Wordline leakage-related defects (e.g., current leakage from one wordline to another or to the substrate) can become more and more acute as memory device sizes scale down. Moreover, some wordline leakage defects do not manifest when the memory device is new, but later result in memory device failure after the stress of a number of program-erase cycles (PEC). This leakage can cause the faulty wordline to fail to program and corresponding data can be corrupted. Consequently, wordline leakage result in data loss and a reduction in reliability.

Certain systems employ wordline leakage testing to identify memory blocks that are experiencing wordline leakage. These approaches are configured to identify memory blocks that failed due to wordline leakage, and are unable to detect a leakage failing memory block prior to data loss. In addition, typical systems employ wordline leakage testing involving long test times, which has a negative impact on the overall performance of the memory sub-system. Moreover, conventional wordline leakage testing requires the biasing of a wordline to a high voltage level, such that the data in the memory block is no longer valid and needs to be erased before it can be reused.

Aspects of the present disclosure address the above and other issues by implementing a wordline leakage check "in field" or throughout the usage and life of a memory device to identify and retire leakage-failing memory blocks. According to embodiments, during the lifecycle of a memory device (also referred to as "in-use"), a memory block is monitored to determine if wordline leakage is detected (herein referred to as "in-use wordline leakage monitoring"). In an embodiment, the in-use wordline leakage monitoring process includes initial processing to identify and select a memory block to be subject to the wordline leakage testing. In an embodiment, the wordline leakage test is performed for a selected memory block when that memory block is moved into a data location designated for a garbage collection operation (also referred to as a "garbage collection pool"). The selection of memory block that is moved to the garbage collection pool is performed after the data of the memory block has been copied to another memory block. Advantageously, execution of the wordline leakage test for memory blocks selected from the garbage pool, following the copying of the data to another memory block, enables the impact to write performance to be minimized by executing the wordline leakage test during the idle state.

In an embodiment, the memory block is selected for wordline leakage testing based on the PEC lifecycle associated with the memory block. Upon entry of a memory block into the garbage collection processing, a check of a media endurance metric (e.g., a PEC count) associated with the memory block is performed. If the PEC count satisfies a condition, the memory block is selected for further processing in a next phase of the in-use wordline leakage testing management process. During the next phase, a temperature associated with the memory block is determined. The memory block temperature is compared to a threshold to determine whether it is within an acceptable temperature range. If so, an erase operation is performed on the memory block and a wordline leakage test is executed.

In an embodiment, the wordline leakage test is performed iteratively on each wordline group (wordline group 1 to wordline group N) of the memory block. In an embodiment, each wordline group of the set of wordline groups can include a predetermined number (K) of adjacent wordlines. For example, a first wordline group can include wordlines 1 through K (where K=32), a second wordline group can include wordlines 33 to 64, a third wordline group can include wordlines 65 to 86, and so on.

For example, in a first iteration (i=1), the wordline leakage test is performed on wordline group 1, in a second iteration (i=2), the wordline leakage test is performed on wordline group 2, and so on. Each iteration of the wordline leakage test corresponding to each wordline group produces a wordline leakage test result (e.g., a passing test result or a failing test result). In an embodiment, following the completion of the wordline leakage testing iterations for all of the wordline groups of the block (e.g., i=N), if all wordline groups pass the wordline leakage test, the memory block can be released to the garbage collection pool. In an embodiment, if a wordline group of the set of wordline groups of the memory block fails the wordline leakage test, the memory block is retired and no longer used by the memory sub-system. Advantageously, the in-use wordline leakage monitoring enables the recovery of data from a memory block before that memory block becomes a hard fail, thereby avoiding data loss and reduce the corresponding reliability risk.

Figure 1A:
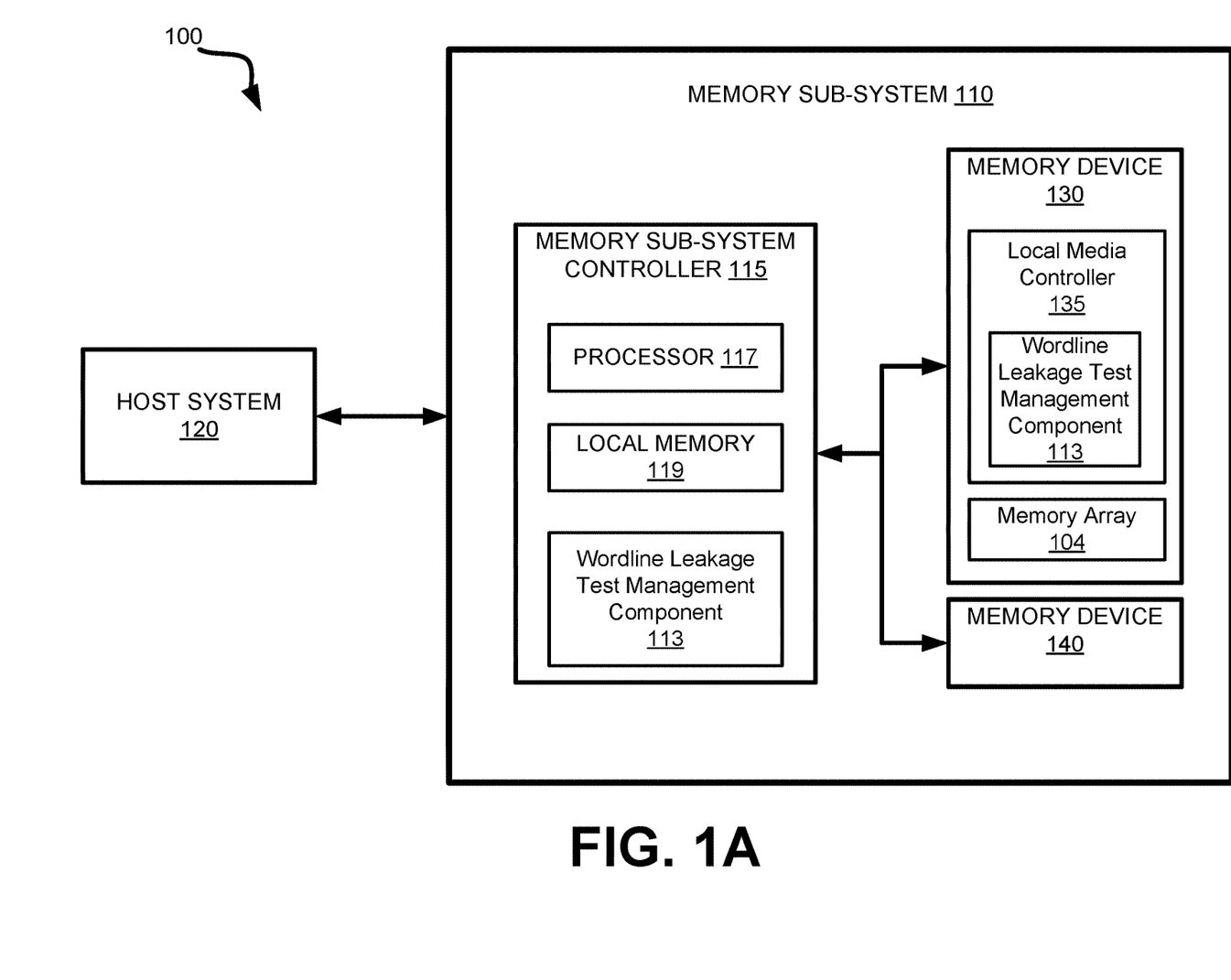
FIG. 1A illustrates an example computing system that includes a memory sub-system, in accordance with one or more embodiments of the present disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a wordline leakage test management component 113 that can manage execution of wordline leakage testing to determine when/if a segment (e.g., a memory block) of memory array 104 of memory device 130 exhibits wordline leakage and is to be retired. A memory block may have some pages containing valid data and some pages containing invalid data. To avoid waiting for all of the pages in the block to have invalid data in order to erase and reuse the memory block, an algorithm hereinafter referred to as "garbage collection" can be invoked to allow the memory block to be erased and released as a free block for subsequent write operations. Garbage collection is a set of media management operations that include, for example, selecting a memory block that contains valid and invalid data, selecting pages in the block that contain valid data, copying the valid data to new locations (e.g., free pages in another block), marking the data in the previously selected pages as invalid, and erasing the selected block.

"Garbage collection", a "garbage collection process", or "garbage collection processing" hereinafter refers to selecting a memory block to be released to a garbage collection pool, rewriting the valid data from the selected memory block to another memory block, and erasing all invalid data and valid data stored at the selected memory block. The valid data from multiple selected memory blocks can be copied to a smaller number of other memory blocks and the selected memory blocks can then be erased. As a result, the number of memory blocks that have been erased can be increased such that more memory blocks are available to store subsequent data from a host system. A memory block that is collected and released to a garbage pool includes no valid data, such that the memory block is available for a subsequent program operation.

In an embodiment, wordline leakage test management component 113 identifies a memory block that is identified for garbage collection processing. In an embodiment, before the memory block is released to the garbage pool, the wordline leakage test management component 113 performs a set of wordline leakage test management operations to determine whether there is wordline leakage with respect to the memory block and whether the memory block is to be released to the garbage pool (e.g., the memory block passes the wordline leakage test) or retired (e.g., the memory block fails the wordline leakage test).

In an embodiment, the wordline leakage test management component 113 initiates a wordline leakage test management process. In an embodiment, the wordline leakage test management component 113 determines a program/erase cycle (PEC) count associated with the memory block for use in determining whether the memory block is to be released to a garbage collection pool or tested for wordline leakage. In an embodiment, the PEC count check is performed to determine if the PEC count satisfies a first condition and a second condition. In an embodiment, if the first condition is satisfied, the PEC count is checked to determine if the second condition is satisfied. In an embodiment, if both the first condition and the second condition are satisfied, the memory block is identified for further processing in accordance with the operations of the wordline leakage testing management process. If either the first condition or the second condition are not satisfied, the memory block is released to the garbage collection pool.

In an embodiment, if both the first condition and the second condition are satisfied, wordline leakage test management component 113 determines a temperature of the memory block. The temperature of the memory block is compared to a threshold temperature range (e.g., an acceptable temperature range having a minimum threshold temperature and a maximum threshold temperature) to determine if a temperature condition is satisfied (i.e., determine whether the determined or measured temperature of the memory block is within the threshold temperature range). In an embodiment, if the measured temperature is not within the threshold temperature range, the memory block is marked or identified to be processed by the wordline leakage test management component 113 on a next or subsequent PEC and released to the garbage collection pool. In an embodiment, at the subsequent PEC, when entering the garbage collection pool, the PEC check is skipped and the memory block is advanced to the next stage of the process where the temperature of the marked memory block is measured and compared to the threshold temperature range.

In an embodiment, if the temperature condition is satisfied (i.e., the memory block temperature is within the threshold temperature range (e.g., within a minimum threshold temperature of 40° C. and a maximum temperature range of 60° C.), the memory block is erased (e.g., an SLC erase operation is performed on the memory block).

In an embodiment, wordline leakage test management component 113 causes execution of a wordline leakage test on a first wordline group of a set of wordline groups (e.g., a set of "i" wordline groups, where e.g., i=8) of the erased memory block. Wordline leakage test management component 113 iterative tests each wordline group of the memory block to determine whether a wordline group fails the wordline leakage test. If the wordline leakage test fails for a tested wordline group of the memory block, the memory block is retired. If a tested wordline group passes the wordline leakage test, the test is executed on a next wordline group of the memory block, until all of the wordline groups have been tested. In an embodiment, if the wordline leakage test is passed for each of the wordline groups of the set of wordline groups of the memory block, the memory block is released to the garbage collection pool. In an embodiment, one or more portions of the wordline leakage test management component 113 of the memory sub-system controller can cause the execution of the wordline leakage test by one or more portions of the wordline leakage test management component 113 of the local media controller 135. Further details with regards to the operations of wordline leakage test management component 113 are described below.

Figure 1B:
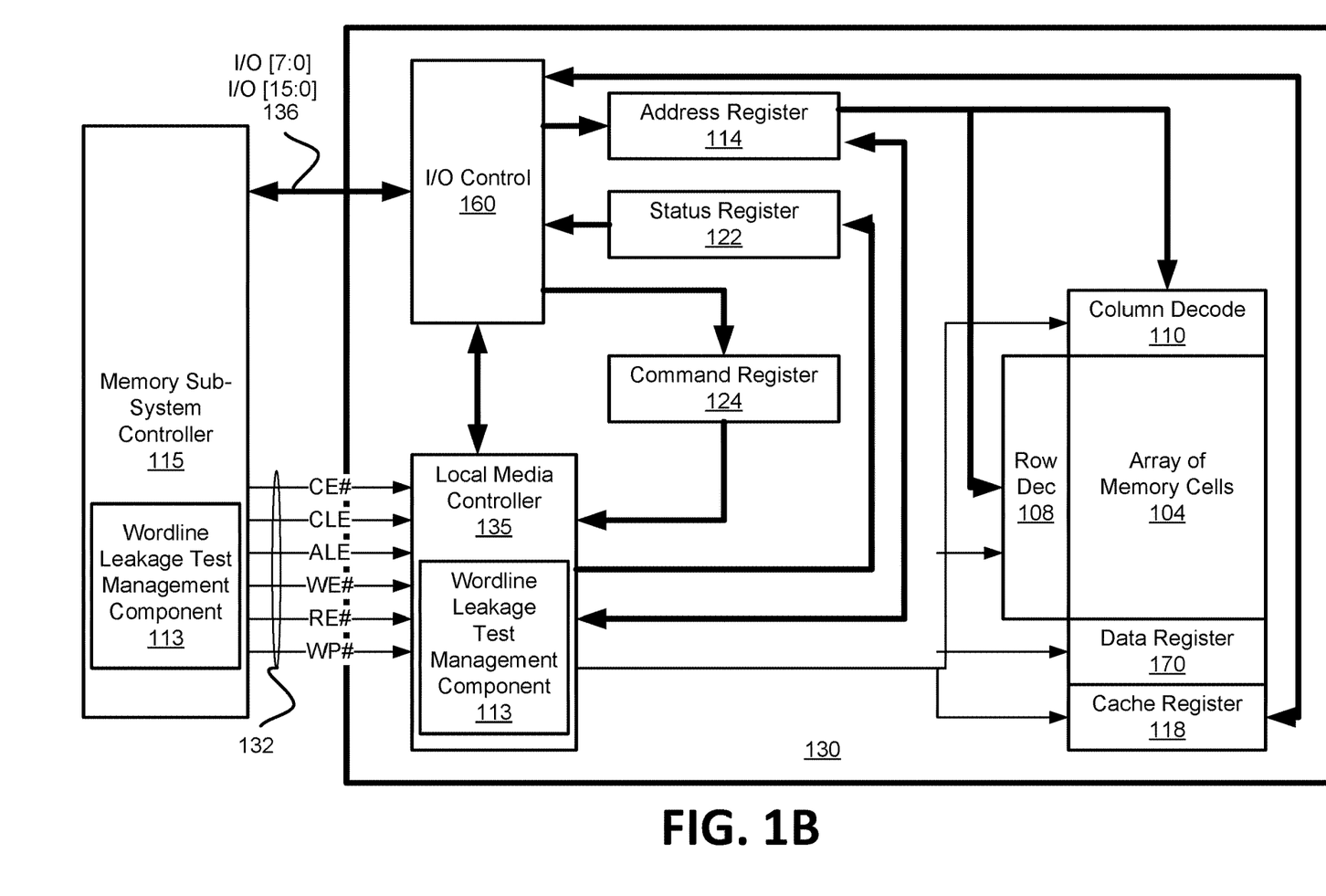
FIG. 1B is a block diagram of memory device(s) in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device(s) 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 110 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device(s) 130. An address register 114 is in communication with I/O control circuitry 160 and row decode circuitry 108 and column decode circuitry 110 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 110 to control the row decode circuitry 108 and column decode circuitry 110 in response to the addresses. In one embodiment, the memory sub-system controller 115 and the local media controller 135 include portions of the wordline leakage test management component 113 which are configured to enable communication between the memory sub-system controller 115 and the local media controller 135 to perform the steps and operations associated with the management of the wordline leakage testing of one or more of memory device(s) 130, in accordance with embodiments of the present application.

The local media controller 135 is also in communication with a cache register 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 160. During a read operation, data may be passed from the cache register 118 to the I/O control circuitry 160 for output to the memory sub-system controller 115; then new data may be passed from the data register 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 204, e.g., by sensing a state of a data line connected to that memory cell. A status register 122 may be in communication with I/O control circuitry 160 and the local memory controller 135 to latch the status information for output to the memory sub-system controller 115.

Memory device(s) 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 160 and may then be written into command register 124. The addresses may be received over input/output (I/O) pins [7:0] of I/O bus 136 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 118. The data may be subsequently written into data register 170 for programming the array of memory cells 104.

In an embodiment, cache register 118 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2:
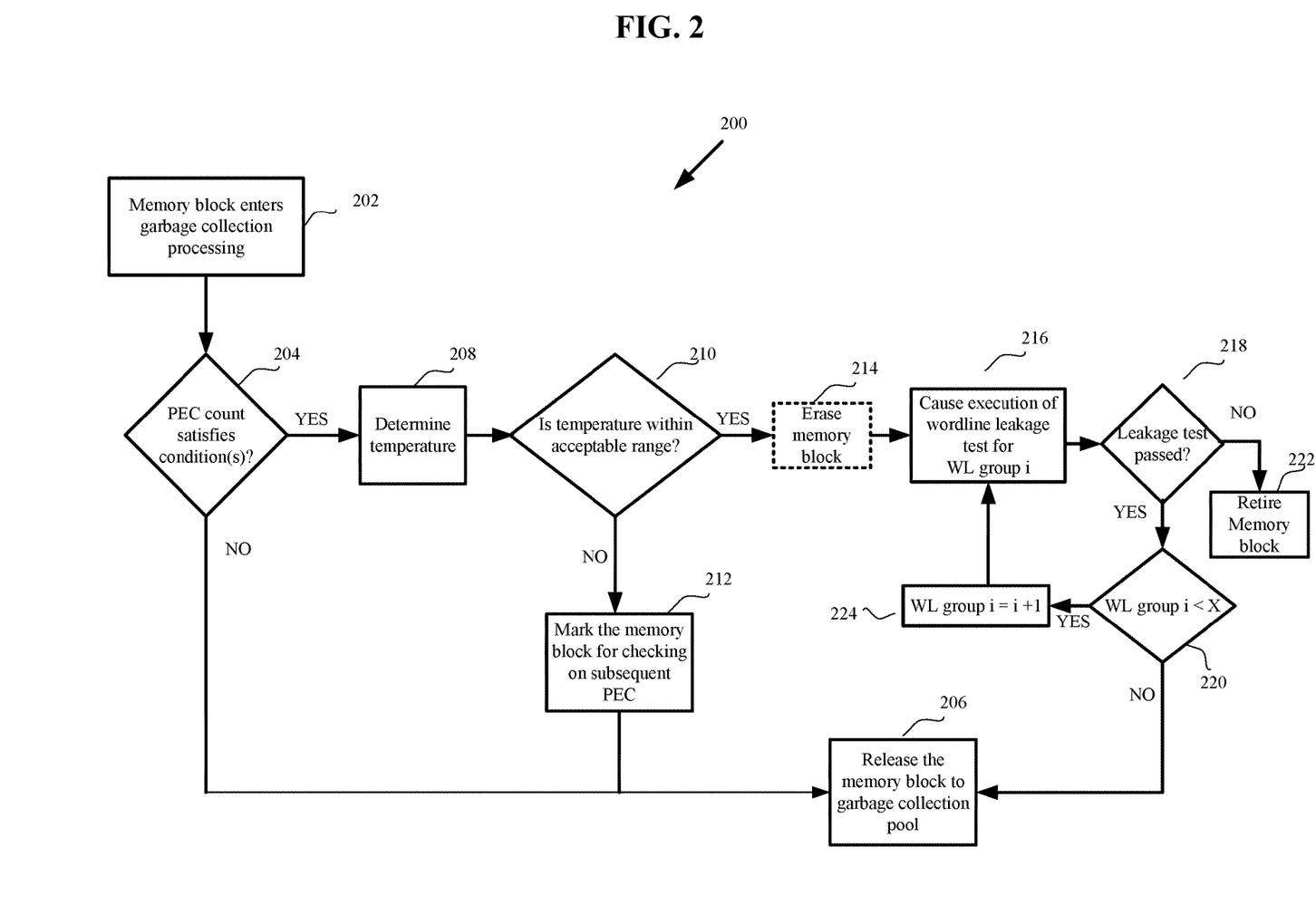
FIG. 2 is a flow diagram of an example method of managing in field wordline leakage testing of a memory block of a memory device in a memory sub-system, in accordance with one or more embodiments of the present disclosure.

FIG. 2 is a flow diagram of an example method of managing execution of wordline leakage testing of a selected memory block in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by wordline leakage test management component 113 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 202, a memory block enters garbage collection processing. In an embodiment, the memory block is identified as having no valid data (e.g., valid data=0) and is considered for release to a garbage collection pool. Prior to release to the garbage collection pool, in operation 204, processing logic (e.g., wordline leakage test management component 113 of FIGS. 1A and 1B) determines a PEC count associated with the memory block. In an embodiment, the processing logic determines if the PEC count of the memory block satisfies a first condition. In an embodiment, the first condition is satisfied if the PEC count of the memory block is greater than or equal to a first threshold level (e.g., a first threshold PEC count). The first threshold level can be an integer value corresponding to the PEC count (e.g., 30, 50, 100, 200, etc.) which is set to provide a minimum PEC count corresponding to the wordline leakage test management process. In an embodiment, the leakage testing threshold level is a PEC count indicating when the memory block is to be checked to determine if the second condition is satisfied. For example, the first threshold level can be set to a PEC count of 50, such that the first condition is satisfied if the measured PEC count of the memory block is 50 or higher. If the first condition is satisfied, the processing logic determines is a second condition associated with the PEC count is satisfied. If the measured PEC count of the memory block is below the first threshold level (e.g., below 50), the PEC check decision 204 is "NO" and the flow proceeds to operation 206 where the memory block is released to the garbage collection pool.

In an embodiment, if the first condition is satisfied, the PEC count of the memory block is checked to determine if the second condition is satisfied. The second condition is satisfied if modulus X of the PEC of the memory block is zero (where X is a predetermined integer such as 20, 30, etc.). For example, for modulus X=10, the PEC count satisfies the second condition of operation 204 when the PEC count is 10, 20, 30, 40, and so on. Accordingly, in this example, the decision in operation 204 is "YES" and flows to operation 208 when the PEC of the memory block is 10, 20, 30, 40, etc. and flows to operation 206 (release to the garbage collection pool) when modulus X of the PEC of the memory block does not equal zero (e.g., for PEC count 0-9, 11-19, 21-29, 31-39, etc.)

At operation 208, for the memory block satisfying the PEC conditions in operation 204, the processing logic determines, detects, or measures a temperature of the memory block. In operation 210, the processing logic determines if the temperature is within a threshold temperature range (e.g., an acceptable temperature range). The threshold temperature range can include a minimum threshold temperature (e.g., 40° C.) and a maximum threshold temperature (60° C.). If in operation 210 the processing logic determines the memory block temperature is within the threshold temperature range, the process continues to operation 212. Alternatively, if the processing logic determines that the memory block temperature is not within the temperature range, the process continues to operation 212. Advantageously, if the temperature of the memory block is outside of the threshold range, In operation 212, the memory block is marked or identified to be processed by the wordline leakage test management component 113 on a next or subsequent PEC, and the memory block is released to the garbage collection pool in operation 206. In an embodiment, a memory block that is marked for processing on a subsequent PEC in operation 212 can, on the next PEC, skip operation 204 and proceed to operation 208 for the temperature check. For example, if the temperature check fails on PEC 100 (e.g., for modulus X=50 in operation 204), the memory block is marked or otherwise identified such that on PEC 101, operation 204 is skipped and the temperature of the memory block is determined in operation 208.

In an embodiment, if the temperature is determined to be within the threshold temperature range in operation 210, the process 200 can continue to operation 214. In operation 214, an erase operation is executed on the memory block. In an embodiment, the erase operation of 214 can be a shallow erase operation, such as a SLC erase operation. In some embodiments, operation 214 is optional and may not be performed (as denoted by the dashed line in FIG. 2), and in such cases, the process 200 continues from operation 210 to operation 216. For example, the erase operation in operation 214 may not be performed for a memory sub-system configured to fully program a memory block.

In operation 216, a wordline leakage test is executed with respect to a wordline group of a set of wordline groups of the memory block. In an embodiment, the wordline leakage test is executed in a "gang" or "group" mode in which the wordline leakage test is executed on a group of X wordlines (e.g., where X=8 wordline groups) of the identified memory block. In an embodiment, each wordline group includes a set of wordlines. For example, a first wordline group can include wordlines 1 through 32, a second wordline group can include wordlines 33 to 64, a third wordline group can include wordlines 65 to 86, and so on. The wordline leakage test is iteratively executed on each of the wordline groups (e.g., wordline group 1 to X), and if the test passes for each wordline group, the memory block can be released to the garbage collection pool. In an embodiment, if the wordline leakage test for a wordline group fails, the memory block is retired. Further details relating to an example wordline leakage test are described below with reference to FIG. 3.

In an embodiment, the processing logic (e.g., a portion of the wordline leakage test management component 113) of the memory sub-system controller (e.g., memory sub-system controller 115 of FIGS. 1A and 1B) sends a command or instruction to processing logic (e.g., a portion of the wordline leakage component 113) of the local media controller (e.g., local media controller 135 of FIGS. 1A and 1B) to cause the execution of the wordline leakage test. In an embodiment, upon receipt of the command to execute the wordline leakage test (e.g., the one or more iterations of the wordline leakage test on the respective wordline groups of the memory block) to determine, in operation 218, if the leakage test passed or failed. In an embodiment, if the leakage test for a wordline group passes, the process 200 continues to operation 220 to determine if all of the wordline groups (e.g., wordline groups 1 to X) have been tested for wordline leakage.

In the example shown in FIG. 2, in operation 216, the processing logic executes the wordline leakage test for a current wordline group "i", where i=1. In operation 218, a determination is made whether the wordline leakage test for wordline group i=1 passes (and proceeds to operation 220) or fails (and proceeds to operation 222). IN an embodiment, if the wordline leakage test fails for wordline group i=1, the memory block is retired in block 222. If the wordline leakage test passes in operation 218, the process continues to operation 220 to determine if all of the wordline groups (e.g., 1 to X) have been tested. If the wordline group that was tested (e.g., i=1) is not the last wordline group in the set of wordline groups (e.g., I<X), the process 200 proceeds to operation 224 and the wordline group number is incremented by 1 (e.g., i=i+1) for execution of the wordline leakage test on the next wordline group in operation 216. The iterative process shown in operations 216 through 220 continues until all of the wordline groups have been tested (e.g., i=X) and passed the wordline leakage test, at which point the process 200 proceeds to block 206 and the memory block is released to the garbage collection pool.

In an embodiment, in operation 218, a status register bit (e.g., SR[0]) can be set to a first value (e.g., "0") if the wordline leakage test passes or a second value (e.g., "1") if the wordline leakage test fails. In an embodiment, processing logic of the memory sub-system controller can read the value of SR in operation 218 and, based on the value, determine if the process 200 is to proceed to operation 220 (e.g., checking if the last wordline group has been tested in response to a current wordline group passing the wordline leakage test) or operation 222 (e.g., retiring the memory block in response to the current wordline group failing the wordline leakage test).

Advantageously, as illustrated in FIG. 2, the method 200 is executed "in field" or during use of the memory blocks of the memory device. In addition, the above-described implementation of the in field wordline leakage testing enables a proactive recognition of wordline leakage effects, such that a wordline leakage test failure is identified, and the corresponding memory block is retired, before data loss is incurred.

Figure 3:
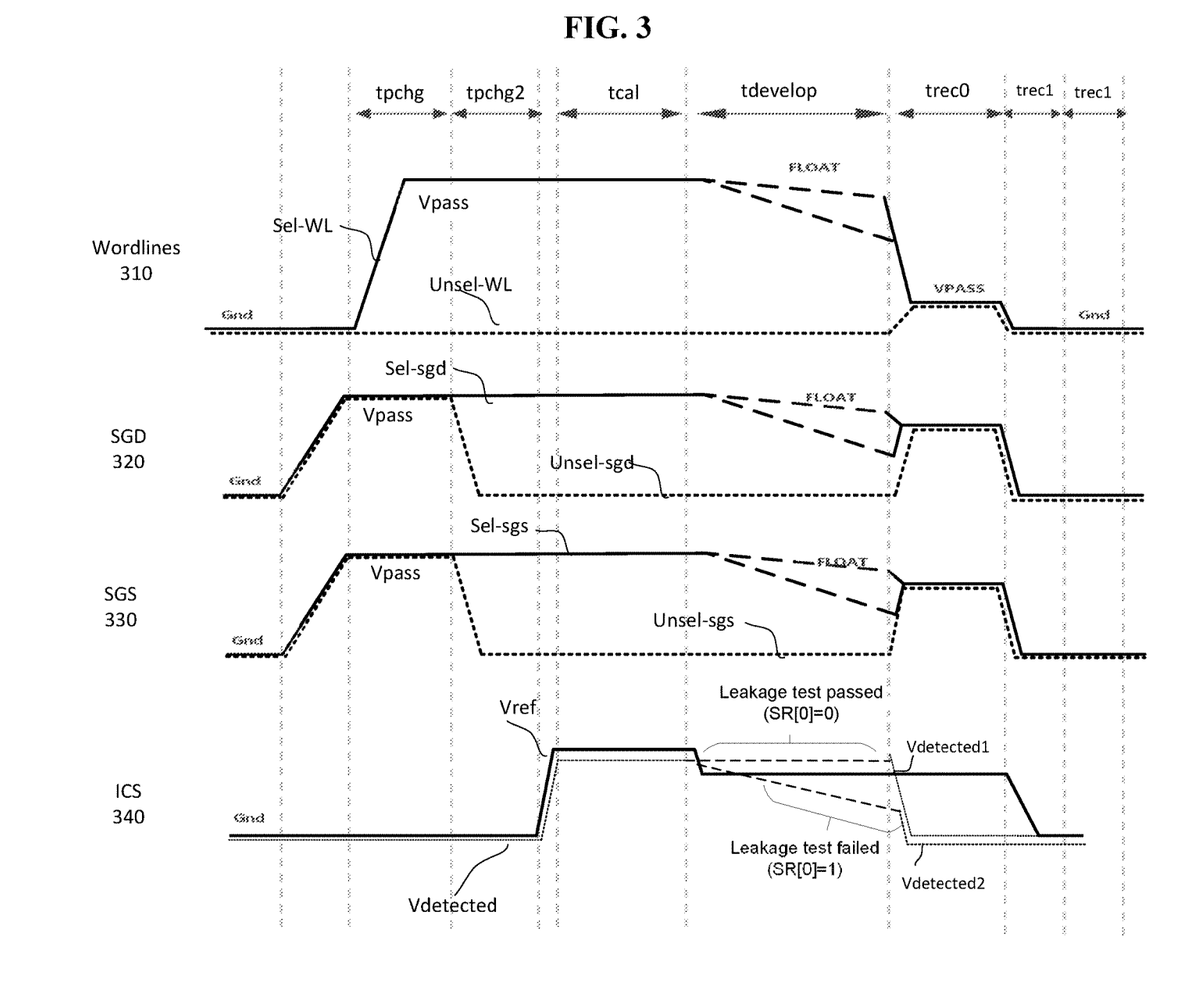
FIG. 3 illustrates example waveforms corresponding to a wordline leakage test of a memory block of a memory device in a memory sub-system, in accordance with one or more embodiments of the present disclosure.

FIG. 3 illustrates example voltage waveforms of various portions of a memory array during execution of a wordline leakage test executed on a memory block (e.g., operations 216 and 218 of FIG. 2). In an embodiment, the wordline leakage test is applied to a current wordline group (e.g., wordline group i of FIG. 2) to determine if the wordline leakage test passes or fails. In an embodiment, as described above in detail with reference to FIG. 2, the wordline leakage is executed iteratively with respect to each wordline group of a set of wordline groups of the memory block until either one of the wordline groups fails the wordline leakage test or all of the wordline groups have been tested and passed.

According to embodiments, the time periods shown in FIG. 3 correspond to the sequencing of the operations of the wordline leakage test. In an embodiment, the wordline voltage is initialized to a known state before taking the wordline leakage measurement. Following the leakage measurement, the wordline voltage is brought back to a safe condition.

In an embodiment, the wordline leakage test is executed to identify leakage from a high voltage level to a low voltage level. In an embodiment, a set of selected wordlines (e.g., Sel-WL) of a wordline group 310 and selected select gates 320, 330 (selected select gate drain (Sel-SGD) and selected select gate source (Sel-SGS)) to be tested are pre-charged during a charging time (tpchg) to a pass voltage level (Vpass) then are disconnected from the voltage supply and left floating (e.g., the "Float" state as denoted by the dashed lines in FIG. 3). In embodiment, the system may wait an additional charging time (tpchg2) before the internal current source (ICS) starts to ramp up to a high level. In an embodiment, the tcal time period represents a time for the ICS to stabilize before the wordlines start to float for current detection.

The unselected wordlines (e.g., the wordlines of the wordline groups that are not being tested) and corresponding unselected select gates (e.g., Unsel-sgs and Unsel-sgd) are set to a low voltage (e.g., a ground (Gnd) voltage level or approximately 0V). After certain develop time (tdevelop), the voltage of the tested wordlines (Vdetected) and select gates is compared with a reference voltage (Vref) via a detection node. In an embodiment, with respect to the waveform associated with ICS 340, if the tested wordlines and/or select gates have any leakage to the adjacent unselected wordlines and select gates or any other nodes, the detected voltage (e.g., Vdetected2 in FIG. 3) falls below the reference voltage (Vref), resulting in a failure of the wordline leakage test (e.g., fail status (SR[0]=1). In an embodiment, if the detected voltage (e.g., Vdetected1 in FIG. 3) remains greater than or equal to the reference voltage (Vref), it is determined that the wordline leakage test passed (e.g., SR[0]=0). In an embodiment, the reading or measurement of the leakage current occurs following the tdevelop time. In an embodiment, a first recovery time (Trec0) represents a time to ramp down the wordline voltages to a Vpass level. IN an embodiment, a further recovery time (Trec1) represents a time to ramp down the wordlines, SGD, SGS, and ICS.

Figure 4:
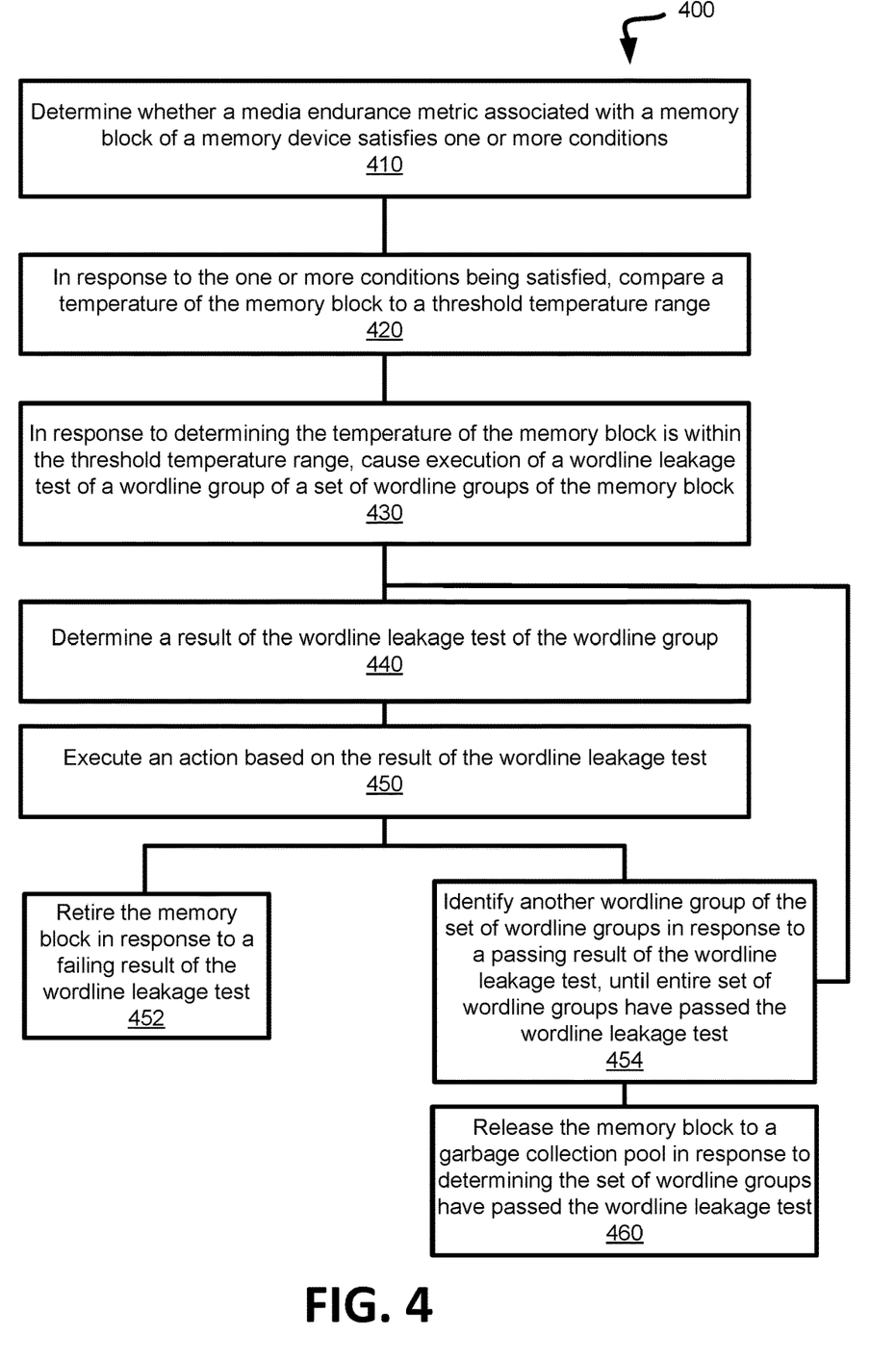
FIG. 4 is a flow diagram of an example method of managing wordline leakage testing of a memory block of a memory device in a memory sub-system, in accordance with one or more embodiments of the present disclosure.

FIG. 4 is a flow diagram of an example method of managing wordline leakage testing of a memory block of a memory device in a memory sub-system, in accordance with one or more embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by wordline leakage test management component 113 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments.

Thus, not all processes are required in every embodiment. Other process flows are possible.

At operation 410, the processing logic (e.g., wordline leakage test management component 113) determines whether a media endurance metric (e.g., a program erase cycle (PEC) count) associated with a memory block of a memory device satisfies one or more conditions. In an embodiment, the media endurance metric (e.g., the PEC count) of the memory block is determined when the memory block is undergoing garbage collection processing to determine if the memory block is to be released to a garbage collection pool. In an embodiment, the one or more conditions includes a first condition associated a threshold PEC count. In an embodiment, the first condition is satisfied if the PEC count of the memory block exceeds a starting or threshold PEC count relating to the wordline leakage test management process. In an embodiment, a memory block having a PEC count that is less than the threshold PEC count is not subject to the wordline leakage test management process. In an embodiment, the threshold PEC count can be set such that the wordline leakage testing is not performed while a memory block is in an early or beginning portion of the memory block's lifecycle.

In an embodiment, if the first condition is satisfied (i.e., the PEC count of the memory block is greater than or equal to the threshold PEC count), a second condition associated with the PEC count can be checked. In an embodiment, the second condition is satisfied when a modulus X of the PEC count equals zero (e.g., where X equals an integer such as 10, 20, 30, 40, etc.) In an embodiment, the second condition is checked for satisfaction so that the further processing in accordance with the wordline leakage testing management process is not performed for each and every PEC cycle of the memory block. In an embodiment, using the second condition, the memory block can be selected or identified for further processing at a desired frequency (e.g., every X number of cycles). In an embodiment, the second condition is satisfied for every X number of cycles (i.e., such that modulus X of the PEC count=0) to control the frequency of timing of when a memory block is to be subjected to the processing of the wordline leakage test management process. In an embodiment, if either the first condition or the second condition relating to the PEC count is not satisfied, the memory block is released to the garbage collection pool.

At operation 420, in response to the one or more conditions being satisfied, the processing logic compares a temperature of the memory block to a threshold temperature range. In an embodiment, the temperature of the memory block is measured and compared to a threshold temperature range including a minimum temperature level (e.g., 40° C.) and a maximum temperature level (e.g., 60° C.). In an embodiment, the measured temperature of the memory block is checked so that, if the temperature is outside of the threshold temperature range (e.g., an acceptable temperature range), the wordline leakage testing is not performed. In an embodiment, in such cases, the memory block can be flagged, marked or otherwise identified to undergo a temperature check (e.g., undergo operation 420) during garbage collection processing on a subsequent or next PEC cycle of the memory block. In an embodiment, the marked memory block is released to the garbage collection pool. In an embodiment, by marking the memory block having an out-of-range temperature, operation 410 can be skipped when the memory block undergoes garbage collection processing on the next or subsequent PEC cycle, and advances to the temperature check of operation 420.

At operation 430, in response to determining the temperature of the memory block is within the threshold temperature range, the processing logic causes execution of a wordline leakage test of a selected wordline group of a set of wordline groups of the memory block. In an embodiment, the processing logic of the memory sub-system controller causes execution of the wordline leakage test by sending a command or instruction to processing logic of a local media controller of the memory device including the memory block. In an embodiment, during a first iteration, a selected wordline group (e.g., wordline group 1) of a set of wordline groups of the memory block undergoes the wordline leakage test. In an embodiment, the wordline leakage test is executed to determine whether a level of wordline leakage that exceeds a threshold level is detected for the wordline group of the memory block. Advantageously, the wordline leakage test threshold level can be established or set to a desired or target level or tolerance such that wordline leakage is detected and identified prior to reaching a point of incurring data loss.

At operation 440, the processing logic determines a result of the wordline leakage test of the target wordline group. In an embodiment, the result can include either a passing result (i.e., the target wordline group passes the wordline leakage test) or a failing result (i.e., the target wordline group fails the wordline leakage test). In an embodiment, a status register bit (e.g., SR[0]) can be set corresponding to the wordline leakage test result (e.g., set to a value of "0" if the test passes or set to a value of "1" if the test fails).

At operation 450, the processing logic executes an action based on the result of the wordline leakage test. In an embodiment, in operation 452, the memory block is retired in response to a failure of the wordline leakage test (e.g., a first result). In an embodiment, alternatively, in operation 454, the processing logic identifies another target wordline group of the set of wordline groups in response to a passing of the wordline leakage test (e.g., a second result). In an embodiment, if there are one or more other wordline groups of the memory block that have not been tested for wordline leakage, process 400 iteratively returns to operation 440 and performs operations 440 and 450 with respect to another wordline group. This process 400 can be performed iteratively until the entire set of wordline groups have passed the wordline leakage test. In an embodiment, in response to determining the set of wordline groups have passed the wordline leakage test, in operation 460, the processing logic releases the memory block to the garbage collection pool.

Figure 5:
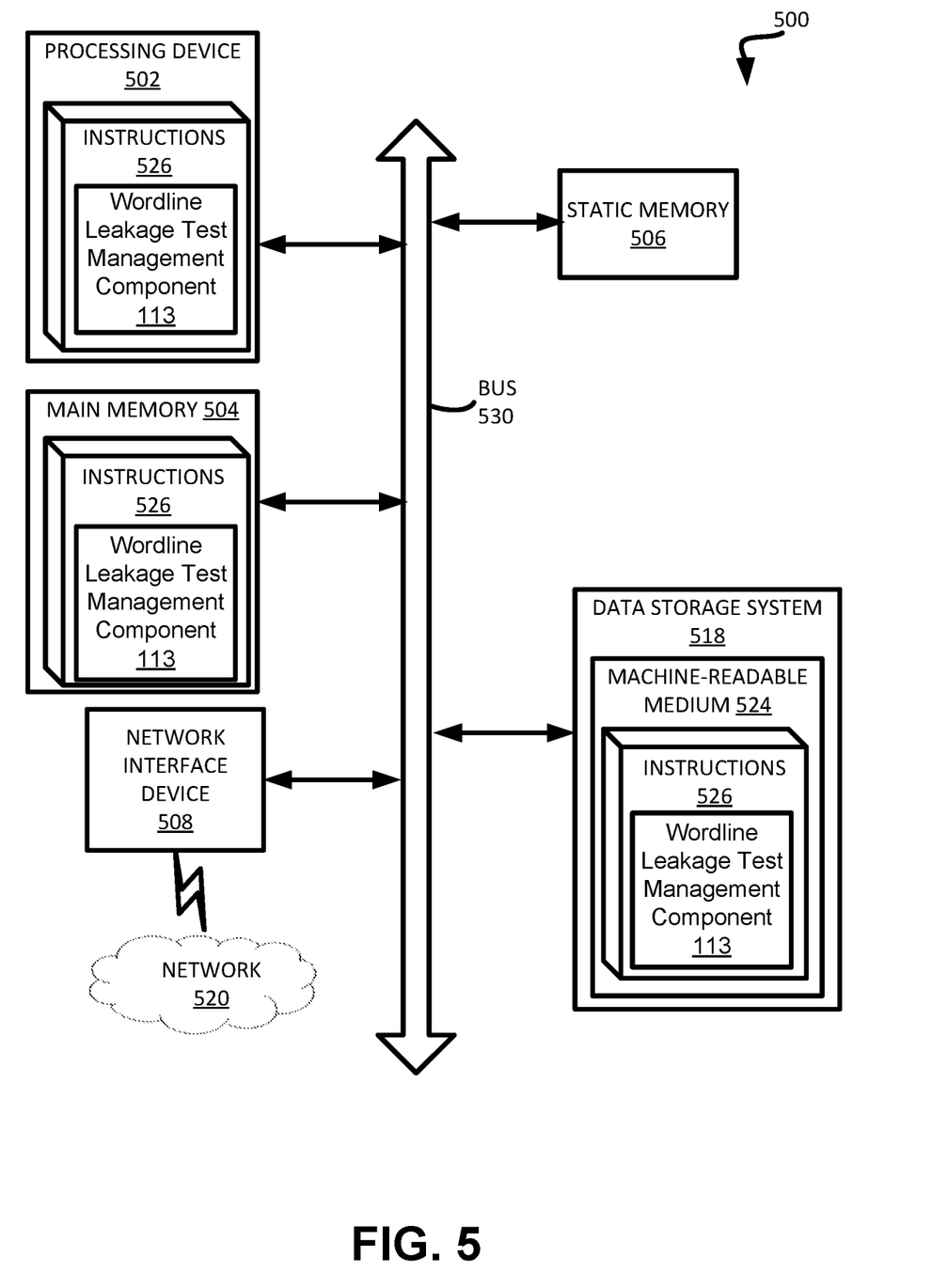
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIGS. 1A and 1B) or can be used to perform the operations of a controller (e.g., to execute an operating system to perform operations corresponding to the wordline leakage test management component 113 of FIGS. 1A and 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIGS. 1A and 1B.

In one embodiment, the instructions 526 include instructions to implement functionality corresponding to the wordline leakage test management component 113 of FIGS. 1A and 1B). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
determining that a program/erase cycle (PEC) count associated with a memory block of the memory device satisfies a first condition, wherein the first condition is satisfied when the PEC count is greater than or equal to a threshold PEC level;
in response to the first condition being satisfied, determining that a modulus value associated with the PEC count satisfies a second condition, wherein the second condition is satisfied when a modulus value associated with the PEC count is equal to 0;
in response to the first condition and the second condition being satisfied, comparing a temperature of the memory block to a threshold temperature range;
in response to determining the temperature of the memory block is within the threshold temperature range, causing execution of a wordline leakage test of a wordline group of a set of wordline groups of the memory block;
determining a result of the wordline leakage test of the wordline group; and
executing an action based on the result of the wordline leakage test.

2. The system of claim 1, wherein the result comprises a failing result associated with the wordline leakage test.

3. The system of claim 2, wherein the action comprises retiring the memory block.

4. The system of claim 1, wherein the result comprises a passing result associated with the wordline leakage test.

5. The system of claim 4, wherein the action comprises causing execution of the wordline leakage test of another wordline group of the set of wordline groups.

6. The system of claim 4, wherein the action comprises:
determining a passing result of the wordline leakage test for each remaining wordline group of the set of wordline groups of the memory block; and
in response to determining the passing result, releasing the memory block to a garbage collection pool.

7. A method comprising:
determining that a program/erase cycle (PEC) count associated with a memory block of a memory device satisfies a first condition, wherein the first condition is satisfied when the PEC count is greater than or equal to a threshold PEC level;
in response to the first condition being satisfied, determining that a modulus value associated with the PEC count satisfies a second condition, wherein the second condition is satisfied when a modulus value associated with the PEC count is equal to 0;
in response to the first condition and the second condition being satisfied, comparing a temperature of the memory block to a threshold temperature range;
in response to determining the temperature of the memory block is within the threshold temperature range, causing, by a processing device, execution of a wordline leakage test of a wordline group of a set of wordline groups of the memory block;
determining a result of the wordline leakage test of the wordline group; and
executing an action based on the result of the wordline leakage test.

8. The method of claim 7, wherein the result comprises a failing result associated with the wordline leakage test; and wherein the action comprises retiring the memory block.

9. The method of claim 7, wherein the result comprises a passing result associated with the wordline leakage test; and wherein the action comprises causing execution of the wordline leakage test of another wordline group of the set of wordline groups.

10. The method of claim 9, wherein the result comprises a passing result associated with the wordline leakage test; and wherein the action comprises:
determining a passing result of the wordline leakage test for each remaining wordline group of the set of wordline groups of the memory block; and
in response to determining the passing result, releasing the memory block to a garbage collection pool.

11. A non-transitory computer-readable storage medium comprising instructions that, when executed by a processing device, cause the processing device to perform operations comprising:
determining that a program/erase cycle (PEC) count associated with a memory block of a memory device satisfies a first condition, wherein the first condition is satisfied when the PEC count is greater than or equal to a threshold PEC level;
in response to the first condition being satisfied, determining that a modulus value associated with the PEC count satisfies a second condition, wherein the second condition is satisfied when a modulus value associated with the PEC count is equal to 0;
in response to the first condition and the second condition being satisfied, comparing a temperature of the memory block to a threshold temperature range;
in response to determining the temperature of the memory block is within the threshold temperature range, causing, by a processing device, execution of a wordline leakage test of a wordline group of a set of wordline groups of the memory block;
determining a result of the wordline leakage test of the wordline group; and
executing an action based on the result of the wordline leakage test.

12. The non-transitory computer-readable storage medium of claim 11, wherein the result comprises a failing result associated with the wordline leakage test; and wherein the action comprises retiring the memory block.

13. The non-transitory computer-readable storage medium of claim 11, wherein the result comprises a passing result associated with the wordline leakage test; and wherein the action comprises causing execution of the wordline leakage test of another wordline group of the set of wordline groups.

14. The non-transitory computer-readable storage medium of claim 11, wherein the result comprises a passing result associated with the wordline leakage test; and wherein the action comprises:
determining a passing result of the wordline leakage test for each remaining wordline group of the set of wordline groups of the memory block; and
in response to determining the passing result, releasing the memory block to a garbage collection pool.

* * * * *